United States Patent [19]

Yero

[11] Patent Number: 5,331,599
[45] Date of Patent: Jul. 19, 1994

[54] DYNAMICALLY SWITCHABLE REFERENCE VOLTAGE GENERATOR

[75] Inventor: Emilio Yero, Aix-en-Provence, France

[73] Assignee: SGS-Thomson Microelectronics, S.A., Gentilly, France

[21] Appl. No.: 32,599

[22] Filed: Mar. 17, 1993

[30] Foreign Application Priority Data

Mar. 18, 1992 [FR] France .................. 92 03213

[51] Int. Cl.$^5$ ............................................ G11C 13/00
[52] U.S. Cl. .................................... 365/226; 365/227; 365/228
[58] Field of Search ................ 365/226, 227, 228; 257/532, 299, 756

[56] References Cited

U.S. PATENT DOCUMENTS 4,527,180 7/1985 Oto .......................... 257/756

FOREIGN PATENT DOCUMENTS 0271686 6/1988 European Pat. Off. .
8906068 6/1989 PCT Int'l Appl. .

OTHER PUBLICATIONS

IEEE Journal of Solid–State Circuit, vol. 27, No. 4, Apr. 1992, pp. 574–581, Kuo et al., "A 512-kb Flash EEPROM Embedded in a 32-b Microcontroller".
IEEE Journal of Solid State Circuits, vol. 27, No. 4, Apr. 1992, pp. 583–587, Miyawaki et al., "A New Erasing and Row Decoding Scheme for Low Supply Voltage Operation 16-Mb/64-Mb Flash Memories".
IEEE Journal of Solid-State Circuits, vol. 26, No. 4, Apr. 1991, pp. 484–489, McConnell et al., "An Experimental 4-Mb Flash EEPROM with Sector Erase".

*Primary Examiner*—Terrell W. Fears
*Attorney, Agent, or Firm*—Robert Groover

[57] ABSTRACT

An integrated circuit memory which includes a subcircuit for generating a programmable reference voltages on-chip from an external high-voltage supply line. Depending on the mode of operation (test, read, write, etc.), the reference voltage is changed.

33 Claims, 3 Drawing Sheets

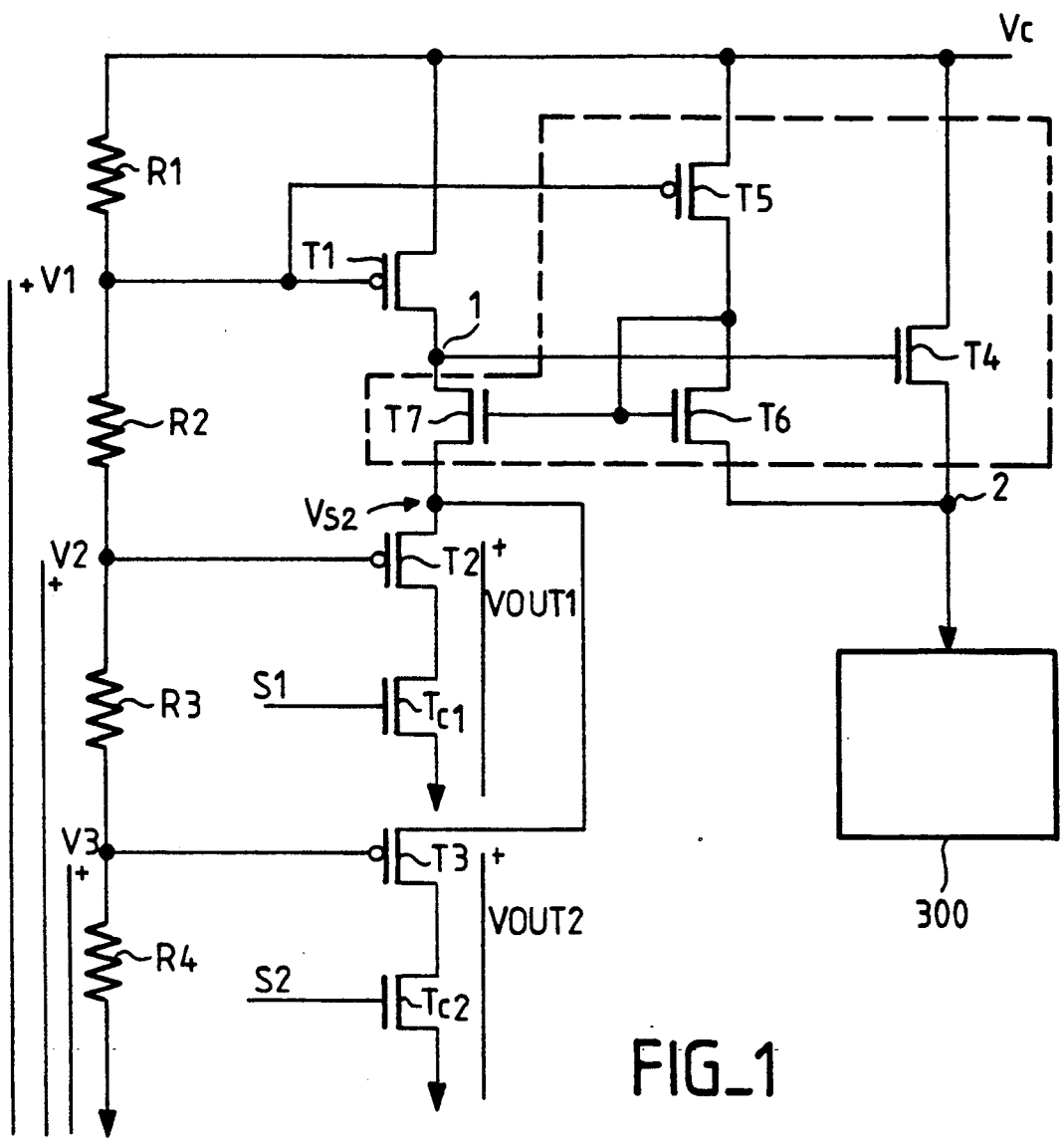
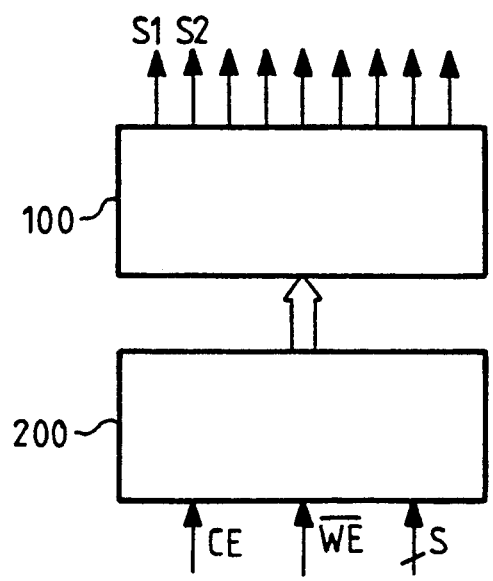
FIG_1

FIG_2
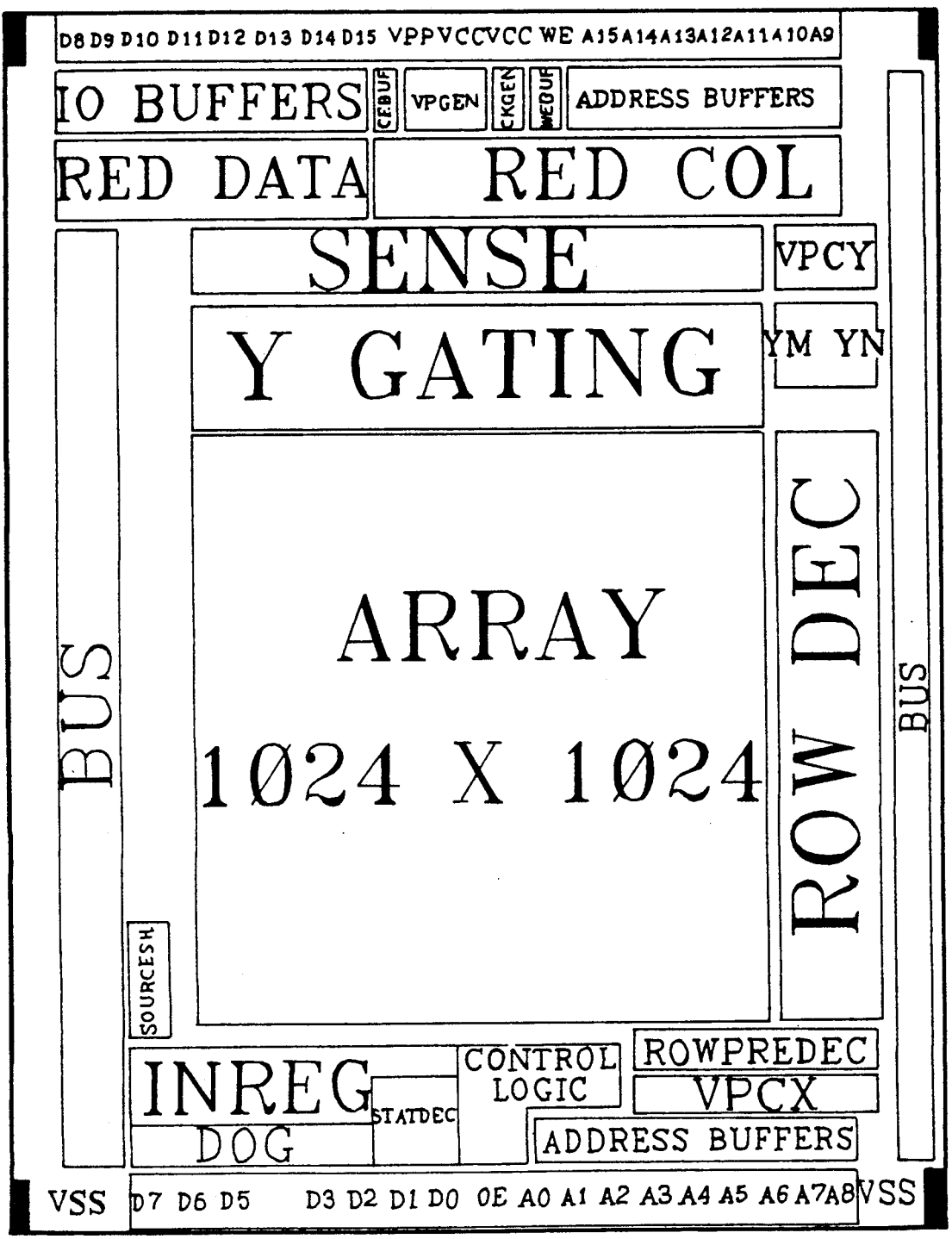

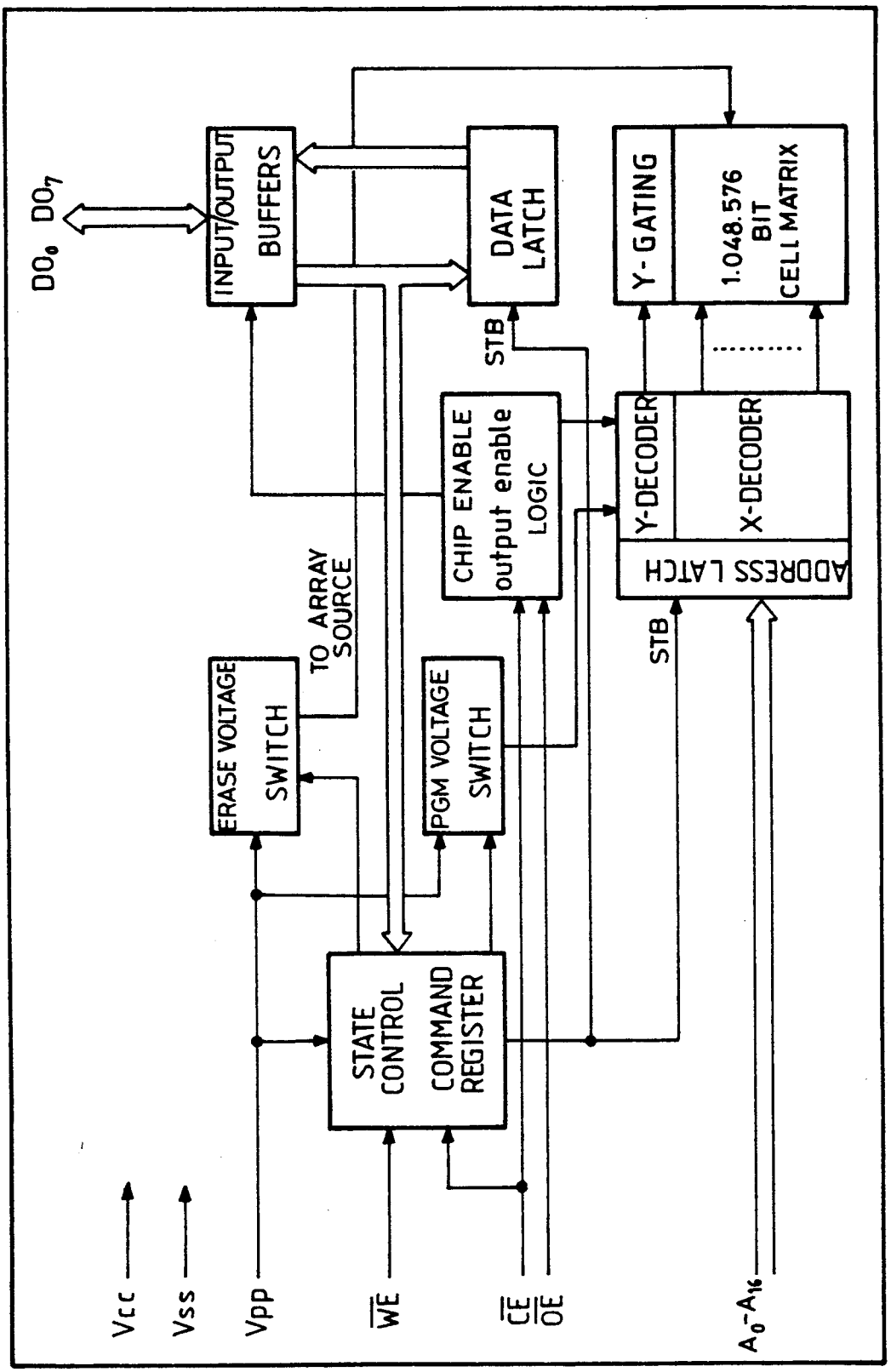
FIG_3

DYNAMICALLY SWITCHABLE REFERENCE VOLTAGE GENERATOR

BACKGROUND AND SUMMARY OF THE INVENTION

The invention relates to the generation of several reference voltages in an integrated circuit, from an external voltage source and a voltage generation circuit. It can be applied especially to non-volatile memories.

Numerous integrated circuits require several reference voltages internally for low or high load current applications. In particular, non-volatile applications require multiple reference voltages for operations of reading, testing, programming or erasure. For example, to program a flash EPROM[1] memory cell, it is necessary to have available a so-called programming voltage Vpp of (for example) 12 volts on the control gate of the cell, a bit line voltage of six volts applied to the drain of the cell, and a source voltage of zero volts. However, in test mode, the voltage applied to the drain of the cell will no longer be equal to six volts but will be equal to seven volts. It should therefore be possible to have both these reference voltages available.

[1] Descriptions of flash EEPROMs may be found, for example, in Kuo et al., "A 512-kb Flash EEPROM Embedded in a 32-b Microcontroller," 27 IEEE J. SOLID-STATE CIRCUITS 574 (April 1992), and references cited therein; McConnell et al., "An Experimental 4-Mb Flash EEPROM with Sector Erase," 26 IEEE J. SOLID-STATE CIRCUITS 484ff (April 1991), and references cited therein; and Miyawaki et al., "A New Erasing and Row Decoding Scheme for Low Supply Voltage Operation 16-Mb/64-Mb Flash Memories," 27 IEEE J. SOLID-STATE CIRCUITS 583ff (April 1992), and references cited therein; all of which are hereby incorporated by reference.

This need to have numerous reference voltages is aggravated by the following factors:

1) It is desirable to avoid putting any unnecessary stress on the memory cells in operational mode, and hence it is desirable to apply to the cells, at all times, the optimum voltages corresponding to each access mode; and
2) In order to obtain the advantages of on-chip-self-testing, it is desirable to have all the key elements located on-chip.

It is often not practicable to provide all these reference voltages at supply terminals of the circuit: the large number of external sources entailed would be a major drawback for the user and the large number of external supply terminals is a major drawback for the manufacturer because it increases the cost of the circuit. It is therefore desirable to find solutions internal to the circuit.

A known internal approach for low-current applications is the charge pump: starting from a nominal voltage, a higher voltage is obtained by multiplier effect. Apart from the fact that this approach is not suited to high current applications, it is also necessary to have as many charge pumps as there are internal reference voltages.

The invention proposed contains a device capable of delivering a predetermined voltage level from a choice of several possible voltage levels. In one improvement, the reference voltage delivered is stable and independent of the load current of the circuit to which it is applied. This device makes it possible to give a circuit all the reference voltages necessary, by logical selection. In the invention, resistor ratios are used to obtain different voltages. Transistors are used to set up a stable reference voltage at the output, as a function of a selected resistor ratio.

Among the innovations disclosed herein is: An integrated circuit, comprising: first and second power-supply connections; first, second, and third mutually matched field-effect transistors of a first channel conductivity type; at least one bias network, connected to provide three different constant bias voltages to the three respective gates of said transistors; said first transistor being operatively connected between said second transistor and said first power-supply connection; said second transistor, and a respective switch in series therewith, being operatively connected between said first transistor and said second power-supply connection; said third transistor, and a respective switch in series therewith, being operatively connected between said first transistor and said second power-supply connection; and logic connected to control both said switches, and to turn on no more than one thereof; whereby the potential intermediate said first and second transistors provides a reference voltage which is dependent on the state of said switches, but is otherwise substantially constant.

Among the innovations disclosed herein is: An integrated circuit, comprising: first and second power-supply connections; first, second, and third mutually matched field-effect transistors of a first channel conductivity type; at least one resistive bias network, connected to first and second power-supply connections, and configured to generate first, second, and third different respective constant bias voltages therefrom, and to provide said three bias voltages to gates of said three matched field-effect transistors; said first transistor having a source operatively connected to a first power-supply connection; said second transistor, and a respective switch in series therewith, being operatively connected, in series with said first transistor, between said first and second power-supply connections; said third transistor, and a respective switch in series therewith, also being operatively connected, in series with said first transistor, between said first and second power-supply connections; logic connected to control both said switches, and to turn on no more than one thereof; whereby the potential intermediate said first and second transistors provides a reference voltage which is dependent on the state of said switches, but is otherwise substantially constant.

Among the innovations disclosed herein is: An integrated circuit, comprising: first and second power-supply connections; first, second, and third mutually matched field-effect transistors of a first channel conductivity type; at least one bias network, connected to provide three different constant bias voltages to the three respective gates of said transistors; said first transistor having a source operatively connected to said first power-supply connection; said second transistor, and a respective switch in series therewith, being operatively connected, in series with said first transistor, between said first and second power-supply connections; said third transistor, and a respective switch in series therewith, also being operatively connected, in series with said first transistor, between said first and second power-supply connections; logic connected to control both said switches, and to turn on no more than one thereof; whereby the potential intermediate said first and second transistors provides a reference voltage which is dependent on the state of said switches, but is otherwise substantially constant.

Among the innovations disclosed herein is: An integrated circuit, comprising: a positive power-supply connection, and a ground connection; first, second, and third P-channel field-effect transistors, all having substantially identical geometries; at least one bias network, connected to provide three different constant bias voltages to the three respective gates of said transistors; said first transistor having a source operatively connected to said power-supply connection; said second transistor, and a respective switch in series therewith, being operatively connected, in series with said first transistor, between said power-supply connection and ground; at least one regulating transistor being interposed between said first and second matched transistors; said third transistor, and a respective switch in series therewith, also being operatively connected, in series with said first transistor, between said power-supply connection and ground; logic connected to control both said switches, and to turn on no more than one thereof; an N-channel output transistor connected to be controlled by a node intermediate between the channels of said first and second transistors, and accordingly to pass current from said power-supply connection to a load terminal; an additional series-connected pair of field-effect transistors, jointly connected in parallel with said output transistor, and including an additional P-channel transistor having a gate connected to the gate of said first matched transistor, and also an additional N-channel transistor having a gate connected to the gate of said regulating transistor; whereby the potential intermediate said first and second transistors provides a reference voltage which is dependent on the state of said switches, but is otherwise substantially constant.

Among the innovations disclosed herein is: A circuit for the generation of reference voltages, comprising: a first transistor placed between a positive voltage source and an output node, and having its gate biased at a first voltage; one second transistor and one third transistor connected in parallel, each being identical to said first transistor, each having its gate biased at a different respective voltage and being mounted in series with a respective switching transistor between said output node and ground; a sequence of resistors in series between the positive voltage source and the ground to deliver different bias voltages to the gates of said first, second, and transistors; logic connected and configured to make only one said switching transistor conductive at a time to generate a determined voltage level at the output of the generation stage.

Among the innovations disclosed herein is: A circuit for the generation of reference voltages according to claim 27, further having an output stage comprising: a fourth transistor capable of conducting a high current, controlled at its gate by the output of the generation stage and connected between the positive voltage source and an output of the device; a fifth transistor and a sixth transistor in series between the positive voltage source and the output of the device, the sixth transistor having a conduction electrode connected to its gate and another conduction electrode connected to the output of the device; a seventh transistor in series between the first transistor and the other transistors of the generation stage; the first transistor and the fifth transistor being identical and having their gates connected together, the sixth and seventh transistors being identical, having their gates connected together and being of the type with conduction opposite that of the first and fifth transistors.

Among the innovations disclosed herein is: An integrated circuit memory, comprising: an array of memory cells; and peripheral circuitry, including address decode logic connected to receive address bits and to access a correspondingly one of said cells; and control logic connected to receive one or more control bits and to select a mode of operation of said peripheral circuitry accordingly; reference-voltage-generating circuit, connected to receive an external voltage supply, and connected to receive bits from said control logic indicating a mode of operation, and to supply at least one reference voltage to said peripheral circuitry in dependence on said bits from said control logic; said reference-voltage-generating circuit comprising first, second, and third mutually matched field-effect transistors of a first channel conductivity type; at least one bias network, connected to provide three different constant bias voltages to the three respective gates of said transistors; said first transistor being operatively connected between said second transistor and said first power-supply connection; said second transistor, and a respective switch in series therewith, being operatively connected between said first transistor and said second power-supply connection; said third transistor, and a respective switch in series therewith, being operatively connected between said first transistor and said second power-supply connection; and logic connected to control both said switches, and to turn on no more than one thereof, in accordance with bits received from said control logic.

Among the innovations disclosed herein is: A method for generating multiple reference voltages on-chip from a single externally supplied voltage, comprising the steps of: providing first, second, and third mutually matched field-effect transistors of a first channel conductivity type; applying three different substantially constant bias voltages to the respective gates of said transistors from a voltage-dividing ladder between first and second power-supply connections; said first transistor being operatively connected between said second transistor and said first power-supply connection; selectably, when a first reference voltage is desired, connecting said second transistor, but not said third transistor, between said first transistor and said second power-supply connection; and selectably, when a second reference voltage is desired, connecting said third transistor, but not said second transistor, between said first transistor and said second power-supply connection; and connecting a node between said first and second transistors to provide a reference voltage which is substantially constant.

BRIEF DESCRIPTION OF THE DRAWING

The present invention will be described with reference to the accompanying drawings, which show important sample embodiments of the invention and which are incorporated in the specification hereof by reference, wherein:

FIG. 1 shows the circuit configuration of the presently preferred embodiment.

FIG. 2 is a high level "floor plan" showing the physical organization of a sample application of the disclosed circuits in a 1M flash EEPROM.[2] In this sample embodiment, node Vc is provided by an externally supplied voltage. In this floor plan, the circuitry of FIG. 1 is used in the block marked VPGEN.

[2] The specific example shown is available from SGS-Thomson Microelectronics as part number M28F1001. This integrated circuit and its data sheet are hereby incorporated by reference.

FIG. 3 shows a block diagram of the sample device embodiment of FIG. 2. In this figure, the circuitry of FIG. 1 is included in the block labelled "PGM Voltage Switch."

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Other features and advantages of the invention shall be given in the following description that in no way restricts the scope of the invention. This description will refer to FIG. 1, which represents an example of a reference voltage device according to the invention. The reference voltage device comprises chiefly a stage for the generation of a reference voltage at output 1. A PMOS transistor T1 is mounted between a positive voltage source Vc and the output 1 of the voltage generation stage. A PMOS transistor T2 is series-mounted with a switching NMOS transistor Tc1 between the output 1 (through NMOS transistor T7, which is part of a current mirror circuit as described below) and the ground. A PMOS transistor T3 is series-mounted with a switching NMOS transistor Tc2 between the output 1 and the ground. The gates of the transistors T1, T2 and T3 are respectively biased by voltages found at a sequence of resistors $R_1$, $R_2$, $R_3$, $R_4$ in series between the positive voltage source Vc and ground. In the figure, $R_1$ is connected to Vc and, through the series of resistors $R_2$ through $R_4$, to ground. The gate of the transistor T1 is connected to the point of interconnection between $R_1$ and $R_2$. The gate of the transistor T2 is connected to the point of interconnection between $R_2$ and $R_3$. The gate of the transistor T3 is connected to the point of interconnection between $R_3$ and $R_4$. The gates of the switching transistors Tc1, Tc2 are controlled by logic signals S1 and S2 coming from a switching logic circuit 100. Only one of these switching transistors can be conductive at a time. Either Tc1 is conductive or Tc2 is conductive, or neither of them is conductive. These switching transistors have a very low equivalent on-state resistance. They are likened to an open circuit (almost infinite resistance) or closed circuit (zero resistance). The voltage generation stage then works as follows.

Let us assume that the logic signals S 1 and $2 are respectively in a logic state 1 and 0. The transistor Tc1 is conductive and brings the drain of the transistor T2 to the ground. The transistor Tc2 is off and the transistor T3 is therefore off too. Since the source of the transistor T1 is biased at the positive voltage Vc, the biasing voltage V 1 of the gate of the transistor T1 will saturate the transistor. The saturation current will then make the transistor T2 go into saturated mode also, the gate of the transistor T2 being biased at the voltage V2. Since the two transistors T1 and T2 are identical, and are passing equal currents, it follows that, at equilibrium, the saturation mode is set up for the two transistors with the same gate-source voltage.

The output of the voltage generation stage can be easily deduced therefrom. It may be seen that $$V_1 = \frac{R_2 + R_3 + R_4}{R_1 + R_2 + R_3 + R_4} V_c \quad (1)$$

and $$V_2 = \frac{R_3 + R_4}{R_1 + R_2 + R_3 + R_4} V_c. \quad (2)$$

The equal $V_{gs}$ drops of T1 and T2 can be written as follows:

$$V_1 - V_{s1} = V_2 - V_{s2}, \quad (3)$$

where $V_{s1}$ and $V_{s2}$ are the source voltages respectively of the transistors T1 and T2, and $V_1$, $V_2$ are their gate voltages. (All these voltages are referenced to ground.)

However, from the circuit diagram it may be seen that $$V_{s2} = V_{OUT1}. \quad (4)$$

(Since T1 and T2 are saturated, the voltage at the source of T2 is fixed). By combining these two we have $$V_{OUT1} = V_{s2} = V_2 - V_1 + V_{s1}, \quad (5)$$

or $$V_{OUT1} = V_2 - V_1 + V_c, \quad (6)$$

Consider the case when T2 is conductive and T3 is off. In this case too Vs1=Vc and (ignoring T7 for the moment) $V_{s2} = V_{OUT1}$ = output of the voltage generation stage, hence:

$$\begin{aligned} V_{OUT1} &= V_2 - V_1 + V_c \\ &= \frac{R_1 + R_3 + R_4}{R_1 + R_2 + R_3 + R_4} V_c. \end{aligned} \quad (7)$$

Suppose now instead that the logic signals S1 and S2 are respectively in a logic state 0 and 1. The transistor Tc2 is conductive and brings the drain of the transistor T3 to the ground. The transistor Tc1 is off, and the transistor T2 is therefore also off.

In the same way as above, the transistor T1 will saturate the transistor, but this time it is transistor T3 which will go into saturated mode. Since the two transistors T1 and T3 are identical, it follows that, at equilibrium, the saturation mode is set up for both transistors with the same gate-source voltage.

The output of the voltage generation stage is easily deduced therefrom:

$$V_1 = \frac{R_1 + R_3 + R_4}{R_1 + R_2 + R_3 + R_4} V_c \quad (8)$$

and The equation of equilibrium is written as follows:

$$V_3 = \frac{R_4}{R_1 + R_2 + R_3 + R_4} V_c. \quad (9)$$

$$V_1 - V_{s1} = V_3 - V_{s3}, \quad (10)$$

where $V_{s1}$ and $V_{s3}$ are the source voltages respectively of the transistors T1 and T3 and $V_1$, $V_3$ are their gate voltages (all with respect to ground).

We also have $V_{s1}=V_c$ and $V_{s3}=V_{OUT2}=$ output of the voltage generation stage when T3 is conductive and T2 is off, whence:

$$V_{OUT2} = \frac{R_1 + R_4}{R_1 + R_2 + R_3 + R_4} V_c \quad (11)$$

Thus, for a given voltage $V_c$, the output voltage will depend only on the choice of the resistance values, and on the resistor ratios.

In a numerical example, we have:

$V_c=12V; R_1=3K\Omega; R_2=5K\Omega; V_1=9V; R_3=1K\Omega;$
$V_2=4V; V_{OUT1}=7V; R_4 3K\Omega; V_c=3V;$
$V_{OUT2}=6V.$ In an application to a flash EPROM memory, the drain voltage of a cell being programmed will be $V_{OUT2}$ (6 volts) under normal programming while, under testing, it should instead be $V_{OUT1}$ (7 volts).

For a non-volatile memory, the invention advantageously provides that the switching transistors Tc1, and Tc2 will be activated by an instruction decoding circuit 200 so as to select the voltage level corresponding to the decoded instruction: reading, programming, erasure, test, etc. This decoding circuit receives the memory selection signal CE and the memory reading/writing signal WE. It generally receives all the signals S necessary to identify a particular operation on the memory.

In one improvement of the invention, an output stage is placed after the voltage generation stage to stabilize the output voltage by compensation of its variations caused by variations in the load current. The output stage preferably comprises a large geometry NMOS transistor T4 to conduct a high current. It is controlled at its gate by the output 1 of the voltage generation stage and it is connected between the voltage source $V_c$ and the output 2 of the output stage.

The output stage further comprises three transistors T5, T6, T7 which form a current mirror with the transistor T1.

The transistors T5 (PMOS) and T6 (NMOS) are placed in series between the positive voltage source $V_c$ and the output 2 of the device. The transistor T7 is placed in series with the transistor T1 between the output 1 of the voltage generation stage and the other transistors T2, T3 of this stage. The transistor T5 is identical to T1. The transistors T6 and T7 are identical, with the type of conduction opposite that of the transistors T1, T5. In the example, the transistors T1 and T5 are P type transistors and the transistors T6 and T7 are N type transistors.

The gates of the transistors T6 and T7 are connected together and to the drain of the transistor T6. The gates of the transistor T5 and T1 are connected together.

The output of the output stage is given in the example of the figure by the node 2 common to the sources of transistors T6 and T4.

Since the transistors T1 and T5 are identical, and biased in the same way, the transistor T5 is also in saturated mode and enforces, on the transistor T6, its saturation current equal to the saturation current of the transistor T1.

Since the transistors T7 and T6 are identical, the transistors T1, T5, T7, T6 form a current matching circuit and the transistors T1 and T7 enforce the same saturation current, the reference voltage of output 1 of the voltage generation stage is found again at the drain of transistor T6. Since this transistor T6 is mounted with the gate and drain connected together, it is in saturation. The gate-source voltage drops of T6 and T7 are therefore equal. Therefore the output of the voltage generation stage is found at output 2 of the output stage.

If the voltage at the output 2 of the device is applied to an application circuit 300, the voltage at the output 2 may drop because of excessive load current drawn from the circuit 300. The voltage at the drain of the transistor T6 will therefore drop and hence the voltage of the gate of transistor T7 will drop also. Transistor T7 will therefore allow less current to pass. Since the transistor T1 is in saturated mode, the saturation current is fixed.

It is therefore the output of the voltage generation stage that will increase to compensate for the drop in current in the transistor T7. The gate voltage of the transistor T4 therefore increases and this transistor T4 conducts more current. Hence, the voltage at the output 2 of the output stage will rise. The transistors T4, T5, T6 and T7 therefore form a negative feedback loop with the transistor T1, and this loop makes it possible to maintain the output voltage by load current compensations.

The voltage generation device described can easily be modified to obtain more than two levels of output voltage: it suffices to increase the number of transistors in series with a switching transistor (T2, Tc1, T3, Tc2, T4, Tc3, ... etc) accordingly, and to choose an appropriate sequence of resistors to obtain the desired voltage levels.

FIG. 2 is a high level "floor plan" showing the physical organization of a sample application of the disclosed circuits in a 1M flash EEPROM.[3] In this sample embodiment, node $V_c$ is provided by an externally supplied voltage. In this floor plan, the circuitry of FIG. 1 is used in the block marked VPGEN.

[3] The specific example shown is available from SGS-Thomson Microelectronics as part number M28F1001. This integrated circuit and its data sheet are hereby incorporated by reference.

FIG. 3 shows a block diagram of the sample device embodiment of FIG. 2. In this figure, the circuitry of FIG. 1 is included in the block labelled "PGM Voltage Switch."

Following are some examples of typical device parameters. However, it will be readily appreciated by those skilled in the art of integrated circuit device and process design that these parameters may be readily modified, and are merely illustrative.

For T1, T2, T5, and T3 (PMOS): W/L=12/6 μm;
$V_T = -0.8$ V.
For T6 and T7 (NMOS): ... W/L=10/1.8 μm,
$V_T = 0.8$ V.
For output NMOS T4: ... W/L=1000/3.2 μm,
$V_T = 0.2$ V.
For Tc1 and Tc2 (NMOS): ... W/L=10/1.8 μm,
$V_T = 0.8$ V.

FURTHER MODIFICATIONS AND VARIATIONS

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit, comprising:
   first and second power-supply connections;
   first, second, and third mutually matched field-effect transistors of a first channel conductivity type;
   at least one bias network, connected to provide three different constant bias voltages to the three respective gates of said transistors;
   said first transistor being operatively connected between said second transistor and said first power-supply connection;
   said second transistor, and a respective switch in series therewith, being operatively connected between said first transistor and said second power-supply connection;
   said third transistor, and a respective switch in series therewith, being operatively connected between said first transistor and said second power-supply connection; and
   logic connected to control both said switches, and to turn on no more than one thereof;
   whereby the potential intermediate said first and second transistors provides a reference voltage which is dependent on the state of said switches, but is otherwise substantially constant.

2. The integrated circuit of claim 1, wherein the potential of said first power-supply connection is closer to the gate potential of said first transistor than to the gate potential of said second transistor.

3. The integrated circuit of claim 1, wherein said first, second, and third transistors are all P-channel field-effect transistors.

4. The integrated circuit of claim 1, wherein said first power-supply voltage connection is connected to a positive voltage, and said second power-supply voltage connection is connected to ground.

5. The integrated circuit of claim 1, wherein said bias network supplies a voltage to the gate of said first transistor which maintains said first transistor in a state of constant saturation.

6. The integrated circuit of claim 1, further comprising an output transistor, having a second channel conductivity type, connected to be controlled by a node intermediate between the channels of said first and second transistors.

7. The integrated circuit of claim 1, further comprising a regulating transistor interposed between said first and second matched transistors, said regulating transistor being controlled to have a negligeable source-drain voltage under normal operating conditions.

8. The integrated circuit of claim 1, further comprising:
   a regulating transistor interposed between said first and second matched transistors;
   an output transistor connected to be controlled by a node intermediate between the channels of said first and second transistors, and accordingly to pass current from said first power-supply connection to a load terminal;
   an additional series-connected pair of field-effect transistors, jointly connected in parallel with said output transistor, and including
      an additional transistor of said first conductivity type having a gate connected to the gate of said first matched transistor, and also
      an additional transistor of said second conductivity type, having a gate connected to the gate of said regulating transistor.

9. An integrated circuit, comprising:
   first and second power-supply connections;
   first, second, and third mutually matched field-effect transistors of a first channel conductivity type;
   at least one resistive bias network, connected to first and second power-supply connections, and configured to generate first, second, and third different respective constant bias voltages therefrom, and to provide said three bias voltages to gates of said three matched field-effect transistors;
   said first transistor having a source operatively connected to a first power-supply connection;
   said second transistor, and a respective switch in series therewith, being operatively connected, in series with said first transistor, between said first and second power-supply connections;
   said third transistor, and a respective switch in series therewith, also being operatively connected, in series with said first transistor, between said first and second power-supply connections;
   logic connected to control both said switches, and to turn on no more than one thereof;
   whereby the potential intermediate said first and second transistors provides a reference voltage which is dependent on the state of said switches, but is otherwise substantially constant.

10. The integrated circuit of claim 9, wherein said first power-supply voltage connection is connected to a positive voltage, and said second power-supply voltage connection is connected to ground.

11. The integrated circuit of claim 9, wherein said bias network supplies a voltage to the gate of said first transistor which maintains said first transistor in a state of constant saturation.

12. The integrated circuit of claim 9, further comprising a regulating transistor interposed between said first and second matched transistors, said regulating transistor being controlled to have a negligeable source-drain voltage under normal operating conditions.

13. The integrated circuit of claim 9, further comprising:
   a regulating transistor interposed between said first and second matched transistors;
   an output transistor connected to be controlled by a node intermediate between the channels of said first and second transistors, and accordingly to pass current from said first power-supply connection to a load terminal;
   an additional series-connected pair of field-effect transistors, jointly connected in parallel with said output transistor, and including
      an additional transistor of said first conductivity type having a gate connected to the gate of said first matched transistor, and also
      an additional transistor of said second conductivity type, having a gate connected to the gate of said regulating transistor.

14. The integrated circuit of claim 9, wherein each said switch is an N-channel field-effect transistor.

15. An integrated circuit, comprising:
first and second power-supply connections;
first, second, and third mutually matched field-effect transistors of a first channel conductivity type;
at least one bias network, connected to provide three different constant bias voltages to the three respective gates of said transistors;
said first transistor having a source operatively connected to said first power-supply connection;
said second transistor, and a respective switch in series therewith, being operatively connected, in series with said first transistor, between said first and second power-supply connections;
said third transistor, and a respective switch in series therewith, also being operatively connected, in series with said first transistor, between said first and second power-supply connections;
logic connected to control both said switches, and to turn on no more than one thereof;
whereby the potential intermediate said first and second transistors provides a reference voltage which is dependent on the state of said switches, but is otherwise substantially constant.

16. The integrated circuit of claim 15, wherein the potential of said first power-supply connection is closer to the gate potential of said first transistor than to the gate potential of said second transistor.

17. The integrated circuit of claim 15, wherein said first, second, and third transistors are all P-channel field-effect transistors.

18. The integrated circuit of claim 15, wherein said bias network consists of a ladder of at least four resistive elements in series between said first and second power-supply connections.

19. The integrated circuit of claim 15, wherein said bias network supplies a voltage to the gate of said first transistor which maintains said first transistor in a state of constant saturation.

20. The integrated circuit of claim 15, further comprising an output transistor, having a second channel conductivity type, connected to be controlled by a node intermediate between the channels of said first and second transistors.

21. The integrated circuit of claim 15, further comprising:
a regulating transistor interposed between said first and second matched transistors;
an output transistor connected to be controlled by a node intermediate between the channels of said first and second transistors, and accordingly to pass current from said first power-supply connection to a load terminal;
an additional series-connected pair of field-effect transistors, jointly connected in parallel with said output transistor, and including
an additional transistor of said first conductivity type having a gate connected to the gate of said first matched transistor, and also
an additional transistor of said second conductivity type, having a gate connected to the gate of said regulating transistor.

22. The integrated circuit of claim 15, wherein each said switch is an N-channel field-effect transistor.

23. An integrated circuit, comprising:
a positive power-supply connection, and a ground connection;
first, second, and third P-channel field-effect transistors, all having substantially identical geometries;
at least one bias network, connected to provide three different constant bias voltages to the three respective gates of said transistors;
said first transistor having a source operatively connected to said power-supply connection;
said second transistor, and a respective switch in series therewith, being operatively connected, in series with said first transistor, between said power-supply connection and ground; at least one regulating transistor being interposed between said first and second matched transistors;
said third transistor, and a respective switch in series therewith, also being operatively connected, in series with said first transistor, between said power-supply connection and ground;
logic connected to control both said switches, and to turn on no more than one thereof;
an N-channel output transistor connected to be controlled by a node intermediate between the channels of said first and second transistors, and accordingly to pass current from said power-supply connection to a load terminal;
an additional series-connected pair of field-effect transistors, jointly connected in parallel with said output transistor, and including
an additional P-channel transistor having a gate connected to the gate of said first matched transistor, and also
an additional N-channel transistor having a gate connected to the gate of said regulating transistor;
whereby the potential intermediate said first and second transistors provides a reference voltage which is dependent on the state of said switches, but is otherwise substantially constant.

24. The integrated circuit of claim 23, wherein said bias network consists of a ladder of at least four resistive elements in series between said first and second power-supply connections.

25. The integrated circuit of claim 23, wherein said bias network supplies a voltage to the gate of said first transistor which maintains said first transistor in a state of constant saturation.

26. The integrated circuit of claim 23, wherein each said switch is an N-channel field-effect transistor.

27. A circuit for the generation of reference voltages, comprising:
a first transistor placed between a positive voltage source and an output node, and having its gate biased at a first voltage;
one second transistor and one third transistor connected in parallel, each being identical to said first transistor, each having its gate biased at a different respective voltage and being mounted in series with a respective switching transistor between said output node and ground;
a sequence of resistors in series between the positive voltage source and the ground to deliver different bias voltages to the gates of said first, second, and transistors;
logic connected and configured to make only one said switching transistor conductive at a time to generate a determined level at the output of the generation stage.

28. A circuit for the generation of reference voltages according to claim 27, further having an output stage comprising:
- a fourth transistor capable of conducting a high current, controlled at its gate by the output of the generation stage and connected between the positive voltage source and an output of the device;
- a fifth transistor and a sixth transistor in series between the positive voltage source and the output of the device, the sixth transistor having a conduction electrode connected to its gate and another conduction electrode connected to the output of the device;
- a seventh transistor in series between the first transistor and the other transistors of the generation stage; the first transistor and the fifth transistor being identical and having their gates connected together, the sixth and seventh transistors being identical, having their gates connected together and being of the type with conduction opposite that of the first and fifth transistors.

29. An electronically programmable memory comprising a device for the generation of reference voltages according to claim 27.

30. An electronically programmable memory according to claim 29, wherein a logical means to make a given switching transistor conductive are controlled by means for the decoding of instructions in order to select a determined voltage level as a function of a decoded instruction.

31. An integrated circuit memory, comprising: an array of memory cells; and peripheral circuitry, including
- address decode logic connected to receive address bits and to access a correspondingly one of said cells; and
- control logic connected to receive one or more control bits and to select a mode of operation of said peripheral circuitry accordingly;
- reference-voltage-generating circuit, connected to receive an external voltage supply, and connected to receive bits from said control logic indicating a mode of operation, and to supply at least one reference voltage to said peripheral circuitry in dependence on said bits from said control logic; said reference-voltage-generating circuit comprising
- first, second, and third mutually matched field-effect transistors of a first channel conductivity type;
- at least one bias network, connected to provide three different constant bias voltages to the three respective gates of said transistors;
- said first transistor being operatively connected between said second transistor and said first power-supply connection;
- said second transistor, and a respective switch in series therewith, being operatively connected between said first transistor and said second power-supply connection;
- said third transistor, and a respective switch in series therewith, being operatively connected between said first transistor and said second power-supply connection; and
- logic connected to control both said switches, and to turn on no more than one thereof, in accordance with bits received from said control logic.

32. The memory of claim 31, wherein said array is an array of flash EEPROM cells, and wherein said reference-voltage-generating circuit provides a first reference voltage during test mode, and a second reference voltage, different from said first reference voltage, during normal read operations.

33. A method for generating multiple reference voltages on-chip from a single voltage externally supplied between first and second power-supply connections comprising the steps of:
- using a voltage-dividing ladder between the first and second power-supply connections to generate three different substantially constant bias voltages to the respective gates of first, second, and third mutually matched field-effect transistors of a first channel conductivity type;
- said first transistor being operatively connected between the second transistor and the first power-supply connection;
- selectably, when a first reference voltage is desired, connecting said second transistor, but not said third transistor, between said first transistor and the second power-supply connection; and
- selectably, when a second reference voltage is desired, connecting said third transistor, but not said second transistor, between said first transistor and the second power-supply connection; and
- connecting a node between said first and second transistors to provide a reference voltage which is substantially constant.

* * * * *